United States Patent
Weiler et al.

(10) Patent No.: US 10,637,383 B2
(45) Date of Patent: Apr. 28, 2020

(54) POWER FACTOR CORRECTION CAPACITOR WEAR DETECTION

(71) Applicant: SCHNEIDER ELECTRIC USA, INC., Andover, MA (US)

(72) Inventors: Richard K. Weiler, Wake Forest, NC (US); Benjamin W. Edwards, Rolesville, NC (US); Alan E. Freeman, Raleigh, NC (US); Kevin M. Jefferies, Raleigh, NC (US); Julius M. Liptak, Knightdale, NC (US); Matthew L. White, Cary, NC (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 0 days.

(21) Appl. No.: 15/848,758

(22) Filed: Dec. 20, 2017

(65) Prior Publication Data

US 2019/0190428 A1    Jun. 20, 2019

(51) Int. Cl.
| | |
|---|---|
| *H02P 23/26* | (2016.01) |
| *G01R 31/327* | (2006.01) |
| *G05F 1/70* | (2006.01) |
| *G01R 31/02* | (2006.01) |

(52) U.S. Cl.
CPC ............ *H02P 23/26* (2016.02); *G01R 31/028* (2013.01); *G01R 31/3274* (2013.01); *G05F 1/70* (2013.01)

(58) Field of Classification Search
CPC ... H02P 23/26; G01R 31/028; G01R 31/3274; G05F 1/70
USPC ........................................................ 318/729
See application file for complete search history.

(56) References Cited

U.S. PATENT DOCUMENTS

| | | | |
|---|---|---|---|
| 5,488,279 A | 1/1996 | Kawamoto et al. | |
| 5,990,642 A * | 11/1999 | Park | H02P 6/185 318/400.04 |
| 8,466,689 B2 | 6/2013 | Younsi et al. | |
| 2008/0077336 A1* | 3/2008 | Fernandes | G01R 15/142 702/57 |
| 2008/0106241 A1* | 5/2008 | Deaver | H02J 3/1828 323/209 |
| 2008/0297085 A1* | 12/2008 | Lee | H02P 21/0085 318/434 |
| 2009/0167541 A1 | 7/2009 | Dooley et al. | |
| 2010/0283435 A1* | 11/2010 | Bremer | G05F 1/70 323/211 |

(Continued)

*Primary Examiner* — Jorge L Carrasquillo
*Assistant Examiner* — Devon A Joseph
(74) *Attorney, Agent, or Firm* — Locke Lord LLP

(57) ABSTRACT

A system and method is provided to monitor wear on a power factor correction capacitor in a motor system. The system and method obtains a baseline inductance angle, reactive power or power factor corresponding to a baseline power factor correction by the capacitor in the circuit; monitors a current supplied to the motor at a location upstream of the capacitor; monitors a voltage supplied to the motor, and determines a present inductance angle, reactive power or power factor based on the monitored current and voltage. The present inductance angle, reactive power or power factor corresponds to a present power factor correction by the capacitor. The system and method can then determine when the power factor correction of the capacitor has degraded to an unsatisfactory level based on a change in the inductance angle, reactive power or power factor from the baseline values, and take appropriate action.

15 Claims, 13 Drawing Sheets

(56) References Cited

U.S. PATENT DOCUMENTS

| | | | | |
|---|---|---|---|---|
| 2011/0241695 A1* | 10/2011 | Younsi | G01R 31/028 | 324/548 |
| 2012/0116696 A1* | 5/2012 | Wank | G01R 31/42 | 702/58 |
| 2013/0286692 A1* | 10/2013 | Patel | H02M 1/32 | 363/37 |
| 2015/0097504 A1* | 4/2015 | Lamascus | H02P 27/04 | 318/490 |
| 2015/0263600 A1* | 9/2015 | Bhandarkar | H02M 7/219 | 363/44 |
| 2015/0333685 A1* | 11/2015 | Wei | H02P 1/16 | 318/430 |
| 2016/0014252 A1* | 1/2016 | Biderman | B60L 15/20 | 455/420 |
| 2016/0133415 A1* | 5/2016 | Bock | H01H 50/002 | |
| 2016/0352091 A1* | 12/2016 | Qi | H02H 3/10 | |
| 2017/0059639 A1* | 3/2017 | Hashmi | G01R 31/028 | |
| 2018/0034393 A1* | 2/2018 | Venturini | H02P 6/26 | |

\* cited by examiner

Power Factor Relationships:

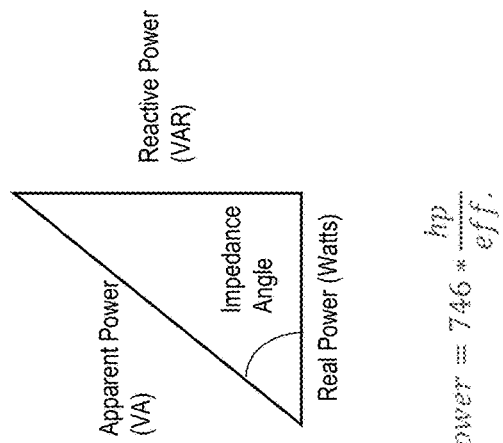

$$Real\ Power = 746 * \frac{hp}{eff.}$$

$$Apparent\ Power = \sqrt{3} * VA$$

$$Power Factor\ (PF) = RealPower/ApparentPower$$

$$Reactive\ Power = Real\ power * \sqrt{1 - PF^2}$$

- Given Motor nameplate values for:
  - Power (hp)
  - Voltage (V)
  - Current (A)
  - Full load efficiency (%)
  - Ratio of PFCC VAR to Motor VAR
- We can calculate
  - Real power (W)
  - Apparent power (VA)
  - Reactive power (VAR)

For full load operation without Power Factor correction Capacitor (PFCC)

- Example
  - 10 hp motor at 460V
  - 86.5% efficiency
  - 14Amps FLC

- Real = 8624 W
  - Apparent = 11154 VA
  - Reactive = 7074 VAR
  - PF = 0.77

FIG. 2

TABLE 1

| Operation Region | C = 0.8 Threshold | C = 0.6 Threshold |
|---|---|---|
| load | M value | M value |
| 0.2-0.4 | 1.86 | 3.06 |
| 0.4-0.6 | 1.95 | 3.55 |
| 0.6-1.0 | 1.98 | 3.79 |
| 1.0-1.4 | 1.99 | 3.9 |

FIG. 5

POWER FACTOR CORRECTION CAPACITOR WEAR DETECTION

FIELD

The present disclosure is related to a method and system which monitors the degradation in the correction performance of power factor correction capacitors, such as used in a motor system.

BACKGROUND

In AC motor systems, inductance in the motor windings can delay current flow, which results in a phase shift and thus transmission of less net power than when voltage and current of the same RMS values are perfectly matched. Power factor is the fraction of power actually delivered in relation to the power that would be delivered by the same voltage and current without the phase shift. A low power factor does not necessarily imply lost or wasted power, but rather excess current. The energy associated with the excess current is alternately stored in the windings' magnetic field and regenerated back to the line with each AC cycle. Such an exchange is referred to as reactive power. Though reactive power is theoretically not lost, the power distribution system must be sized to accommodate such power.

Capacitors can be used to correct or compensate for a lower power factor. These capacitors, referred to as power factor correction (PFC) capacitors or PFCCs, are used with motor loads to correct for the reactive power caused by the motor winding inductance. However, the PFC capacitors degrade over time, and thus, become less effective in their ability to correct for reactive power over time. A failure to monitor the PFC capacitor condition can lead to linear decline in power factor correction effectiveness and eventually catastrophic failure. For higher powered motor systems, the decrease in overall PFC due to degradation in the capacitors can also lead to a surcharge from the utility.

Some systems and methods for monitoring wear of PFC capacitors include routine direct visual, thermal, or electrical inspection of the capacitors themselves to see if the capacitors are still operating, or monitoring electricity charges from the utility which may reflect a surcharge by the utility due to low power factor. However, these systems and methods may not provide for timely notification, and thus, may not enable timely replacement of the PFC capacitors in the motor system, thereby resulting in inefficient operation of the motor system and additional costs to the user.

SUMMARY

To address these and other issues, an improved system and method are provided to monitor and detect for degradation in the power factor correction (PFC) performance of one or more PFC capacitors in a motor system during motor operation. In general, to implement PFC degradation monitoring, the system and method can monitor changes in PFC performance by tracking an inductance angle or other trackable parameters that also correspond to the correction performance state of the PFC capacitors during motor operation. For example, the system and method can establish a profile of the load {motor+PFC} power factor over different regions of motor operation, establish a model of motor performance for levels of correction and motor load, compare current PFC performance to baseline PFC performance, monitor profile parameters continuously over the operating life of the motor equipment, and detect changes indicating PFC wear-out. In the event that the correction performance of the PFC capacitors is no longer adequate (e.g., within a normal window of operation), the system and method can take appropriate action in a timely fashion.

PFC degradation monitoring can be incorporated into an overload relay of a motor starter, and can assist with the reduction or avoidance of electrical cost surcharges due to low power factor caused by degraded PFC performance of worn out capacitors. PFC degradation monitoring also can detect PFC degradation sooner than typical preventative maintenance schemes, continuously and autonomously check the state of wear of the PFC capacitors, and provide notification in a timely fashion to facilitate maintenance or replacement of the PFC capacitors, such as with the scheduling of maintenance or repair and the ordering of parts including new PFC capacitors.

In accordance with an example embodiment, a system and method is provided for monitoring performance of at least one power factor correction capacitor employed in a circuit for supplying power to a motor. The system and method involves obtaining a baseline inductance angle, reactive power or power factor corresponding to a baseline power factor correction by the power factor correction capacitor in the circuit; monitoring a current supplied to the motor at a location upstream of the power factor correction capacitor; monitoring a voltage supplied to the motor; and determining a present inductance angle, reactive power or power factor based on the monitored current and voltage. The present inductance angle, reactive power or power factor corresponds to a present power factor correction by the power factor correction capacitor. The system and method further involves determining when a degradation of the power factor correction of the power factor correction capacitor satisfies a threshold based on a change between the present inductance angle and the baseline inductance angle, between the baseline reactive power and the present reactive power, or between the baseline power factor and the present power factor. The system and method can output or send a notification or perform other actions when the threshold is crossed.

In a further example, the system and method can involve determining baseline inductance angles, reactive powers or power factors and thresholds for a plurality of load operating regions for the motor; determining a load operating region from the plurality of load operating regions based on the monitored current or voltage; and selecting the baseline inductance angle, reactive power or power factor from the baseline inductance angles, reactive powers or power factors, respectively, and the threshold from the thresholds, according to the determined load operating region. The threshold can correspond to a predetermined degradation percentage from the baseline power factor correction, or to a predetermined inductance angle multiple M.

In another example, the system and method further involves dynamically adjusting the motor full load current set point for an overload relay of the motor based on the determined present inductance angle, reactive power or power factor. The full load current set point of the overload is increased toward the motor's maximum rated full load current as power factor correction provided by the power factor correction capacitor decreases.

DESCRIPTION OF THE FIGURES

The description of the various example embodiments is explained in conjunction with the appended drawings.

FIG. 2 illustrates an example of the relationship between real power, apparent power, reactive power and power factor, in accordance with an example embodiment of the present disclosure.

FIG. 5 illustrates a Table 1 including threshold inductance angle multiple M values calculated for four load regions and two different correction ratio values, in accordance with an example embodiment of the present disclosure.

DISCUSSION OF EXAMPLE EMBODIMENTS

In a motor system, power factor correction (PFC) capacitors are used with motor loads to correct for the reactive power caused by motor winding inductance. The capacitors are subject to degradation over time, and failure to monitor PFC capacitor conditions can lead to a linear decline in power factor correction effectiveness and eventually catastrophic failure. Accordingly, a system and method are provided to monitor the degradation in the correction performance of the PFC capacitors during motor operation, and to determine when the power factor correction provided by the capacitors is no longer effective by comparing a present PFC efficiency of the capacitors to a baseline efficiency of the capacitors.

The efficiency of the PFC capacitors in the motor circuit can, for example, be determined by monitoring an inductance angle associated with the reactive power caused by the motor winding inductance when power is supplied to the motor. The system and method can determine a present inductance angle based on current and voltage measurements taken upstream of the PFC capacitors, and compare the present inductance angle to a baseline inductance angle (e.g., the expected inductance angle) to determine the present effectiveness of the PFC capacitors. The baseline inductance angles and thresholds can be based on predetermined models according to motor and PFC parameters, or can be determined by measuring the current and voltage during operation of the motor. Furthermore, the system and method can dynamically adjust a full load current (FLC) set point of an overload relay or other motor equipment with a load FLC setting, according to the correction effectiveness or efficiency of the PFC capacitors. For example, the FLC set point can be a setting for the overload relay, based on a characteristic of the motor, the full load current. FLC is the current drawn by the motor when operating at 100% of its rated load capacity.

Figure 1:
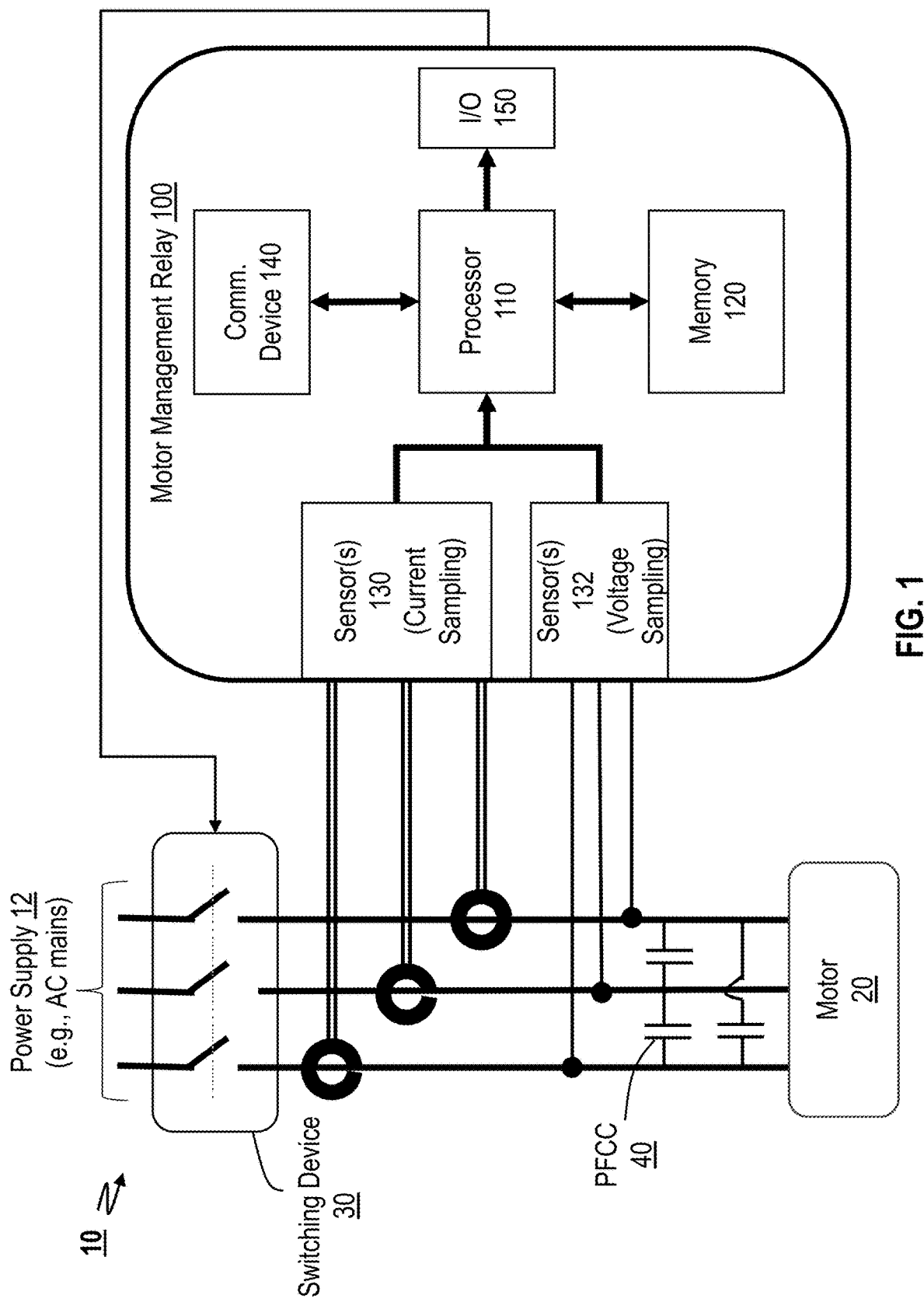
FIG. 1 illustrates a block diagram of a motor system with a motor, a switching device, a motor management relay, and power factor correction capacitors, in accordance with an example embodiment of the present disclosure.

FIG. 1 illustrates an example of a motor system 10, which is configured to monitor PFC degradation of one or more PFC capacitors. The motor system 10 includes a motor 20, a switching device 30 to connect or disconnect the motor 20 to or from a power supply 12 (e.g., AC mains) respectively, one or more power factor correction (PFC) capacitors 40, and a motor management relay 100 to monitor and detect PFC degradation of the PFC capacitors 40 in the motor circuit, to control the switching device 30 to allow or inhibit power to the motor 20 according to specific or predefined conditions or triggering events, to output or transmit information on a state of the motor 20 including the PFC degradation state of the PFC capacitors 40 (e.g., NORMAL, ABNORMAL, or <Percentage> CORRECTION EFFECTIVENESS or EFFICIENCY, etc.), and to dynamically adjust (or cause adjustment of) a set point of a FLC for the relay 100 or other equipment depending on the determined PFC efficiency of the PFC capacitors. In this example, the motor 20 is an inductance motor or other AC motor. The power supply 12 in this example is a three-phase power supply. The switching device 30 can for example be a circuit interrupter such as a contactor or other circuit interruption mechanism or device to selectively allow or inhibit power flow from the power supply 12 to the motor 20 or components thereof.

The motor management relay 100 (also referred to as the "relay 100") can include a processor(s) 110, memory 120, one or more sensors (e.g., 130, 132), communication device(s) 140, and input/output (I/O) 150, which are connected across a bus system. The motor management relay 100 can be powered by a battery, or other available power supply system (or power sources). The sensors can include, for example, a current sensor 130, voltage sensor 132 and/or other devices or systems to sense an electrical characteristic corresponding to the power supplied to the motor 20. In this example, the motor management relay 100 can be an overload relay for the motor 20, such as for example in a motor starter.

The memory 120 is a data storage device that can store computer executable code or programs, which when executed by the processor 110, controls the operations of the motor management relay 100. The memory 120 can also store baseline performance data sets, sensor data from the sensors (e.g., 130, 132) associated with the operations of the motor 20 in one or more load operating regions, history log of motor operations (e.g., PFC efficiency of the PFC capacitor(s), states of the motor, etc.), or other operational data related to the motor 20. The baseline performance data sets can include baselines (e.g., expected value) of the inductance angle, reactive power, power factor or other performance parameter corresponding to the PFC of the PFC capacitors 40 and the comparison threshold for one or more load operating regions of the motor 20. The memory 120 can also store other information (e.g., configuration information, system/device/component parameters and settings, etc.), which is used to control and operate the various components and functions of the relay 100 and the motor system 10.

The communication device(s) 140 can include communication circuitry (e.g., transmitter, receiver, transceiver such as a radio frequency transceiver, etc.) for conducting communications across a network(s) with other remote devices or systems, such as a management control system for a facility (e.g., a computer system with a processor(s), memory, communication device, etc.). For example, the communication device(s) 140 can conduct line-based communications with a remote device via a USB or Ethernet cable interface, or conduct wireless communications with a remote device, such as for example through a wireless personal area network, a wireless local area network, a cellular network or wireless wide area network. The communication device(s) 140 can be used to transmit sensor data associated with the power being supplied to the motor, information relating to PFC efficiency of the PFC capacitors, or other operational data related to the motor 20.

The I/O (Input/Output) 150 includes input and output interfaces to input device(s), and output device(s), respectively. The input devices can include user input devices (e.g., buttons, dials, switches, keyboard or other user input devices) to enable a user to manually set or control operations or other features of the relay 100 and the motor system 10. The output devices can include a display, lights (e.g., LEDs), or other output devices to display information related to the motor 20, such as the state of PFC capacitors including their PFC efficiency, the settings for the relay 100 including nameplate motor parameters and set point of the load FLC, and other operational information related to the status of the motor 20 and components associated therewith. In this example, the processor 110 can also control the switching device 30 or other protection devices, by sending signals or commands to the switching device 30 via the I/O 150.

The processor 110 is configured to control the components and operations of the motor management relay 100. The processor 110 can be a processing system, which can include one or more processors, such as CPU, GPU, controller, dedicated circuitry or other processing unit, which controls the operations of the relay 100, including but not limited to: the operations to monitor the PFC degradation of the PFC capacitors, to dynamically control the set point of the load FLC in the relay 100 or other equipment, and to set various system parameters as described herein (e.g., nameplate FLC, initial set point of the load FLC, baseline inductance angle or corresponding parameters; correction ratio, threshold-related parameters, or other information to implement the processes described herein); the communication operations via the communication device(s) 140; the data access and/or storage operations via the memory 120; and the input and/or output operations via the I/O 150. In relations to the PFC degradation monitoring operations, the processor 110 is further configured to obtain inductance angle, reactive power or power factor baseline for one or more load operating regions, to determine a present inductance angle, reactive power or power factor based on the current and voltage monitored by the sensor (e.g., 130 and/or 132) during motor operation, to determine the PFC efficiency of the PFC capacitors for one or more load operating regions according to the present inductance angle, reactive power or power factor in light of the baselines, to output or transmit information relating to the state and other information of the motor 20 including the state of the PFC capacitors, to dynamically adjust the set point of the load FLC in the relay 100 or other equipment, or other operations described herein.

A more detailed explanation of the principles and example implementations of PFC degradation monitoring, and FLC adjustment, are described below.

A. PFC Degradation Monitoring:

Examples of the PFC degradation monitoring system and method are described below. For the purposes of explanation, the principles of power factor (PF), power factor correction (PFC), and monitoring of the PFC efficiency of PFC capacitors will be initially discussed with reference to FIGS. 2-9.

In an AC motor system, reactive elements such as inductance in the motor windings can delay current flow, which results in a phase shift and thus transmission of less net power than when voltage and current of the same RMS values are perfectly matched. Such a relationship can be reflected as a power factor (PF), which is a ratio of power that is used to do work referred to as real power, and power supplied to a circuit (e.g., the motor circuit) referred to as apparent power. The real power is measured in a unit of Watts (W); and the apparent power is measured in a unit of Volt-Amp (VA). The power associated with the reactive element, e.g., the inductance in the motor winding, is referred to as reactive power, and is measured in a unit called Volt-Amp-Reactive (VAR).

An example of the relationship between real power, apparent power, reactive power and power factor is shown in FIG. 2. In FIG. 2, the real power, apparent power, power factor, and reactive power can be expressed based on the following example equations (1) through (4) as follows:

$$\text{Real Power} = 746 * \frac{hp}{\textit{eff.}}, \tag{1}$$

$$\text{Apparent Power} = \sqrt{3} * VA, \tag{2}$$

$$\textit{PowerFactor}(PF) = \textit{RealPower}/\textit{ApparentPower}, \tag{3}$$

$$\text{Reactive Power} = \text{Real power} * \sqrt{1 - PF^2}, \tag{4}$$

where:
hp is a horse power of the motor,
eff is a full load efficiency (%),

V is RMS voltage, and

A is RMS amperage

In the example of FIG. 2, with no power factor correction, a 10-hp motor at 460V, 86.5% efficiency and 14 amps full load current (FLC), as reflected from the motor nameplate, can operate with a real power of 8624 W, an apparent power of 11154 VA, a reactive power of 7074 VAR, and a PF of 0.77 when fully loaded. The real power output thus would be 77% of the apparent power supplied to the motor.

For an electrical utility, a power factor of 1 (or 100%) is ideal because it is the most efficient means for them to supply power. The utility needs to produce the apparent power, but the user is only using the real power to do work. The reactive power is not doing any useful work. Often the utility will pass along the cost of the reactive power to the user in the form of a power factor correction surcharge. Typically, any PF drawing less than 0.8 or 0.9 would incur such a surcharge. As a solution, the reactive power can be compensated by using appropriately sized capacitors in the circuit.

Given the user's target power factor using PFC capacitor(s) and the uncorrected power factor, it is possible to define a variable C, which is a correction ratio C (e.g., Ratio of PFCC VAR to Motor VAR) which reflects a percentage of correction targeted by the user through the PFC capacitor(s). For example, a C of 0.9 would reflect a 90% correction by the PFC capacitor(s). With known motor parameters from the motor nameplate (e.g., hp, FLC, eff, rated voltage, etc.) and other motor operating parameters, a model can be created reflecting the relationship between inductance angle (also referred to as phi, p or power angle) and correction ratio across different load operating regions, using the relationships set forth in the following example equations (5) through (8):

$$I_M + I_{PFCC} = \sqrt{(\text{load} * PF_M)^2 + (1 - C)^2 * (1 - PF_M^2)}, \quad (5)$$

$$PF_{CM} = \text{load} * \frac{PF_M}{I_M + I_{PFCC}}, \quad (6)$$

$$\varphi = \cos^{-1}(PF_{CM}), \quad (7)$$

$$M = \frac{\varphi}{\varphi_{baseline}}, \quad (8)$$

Where:

C=Correction ratio=Ratio of PFCC VAR to Motor VAR, $PF_M$=Uncorrected Power factor, $PF_{CM}$=Corrected Power factor=cos φ, $I_M+I_{PFCC}$=Motor and PFCC current in proportional units, load=fraction of FLC (Full Load Current), φ=inductance angle, M=inductance angle multiple, and VAR is Reactive Power (Volts-Amps-Reactive).

Figure 3:
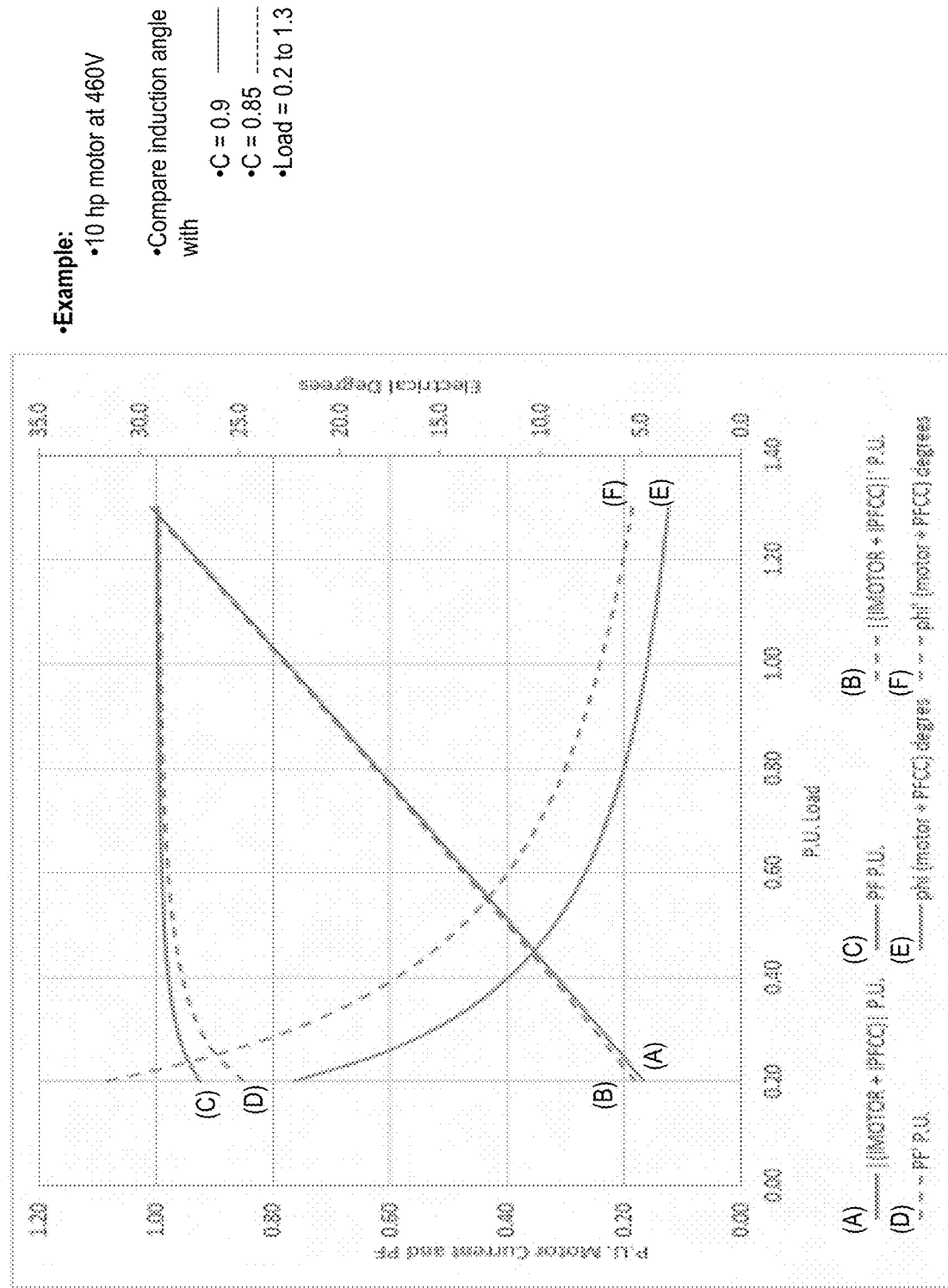
FIG. 3 illustrates an example model reflected in graphs showing the relationship between motor current (in proportional units), power factor and inductance angle across different load operating regions for two different correction ratios, in accordance with an example embodiment of the present disclosure.

FIG. 3 illustrates an example model of graphs showing the relationship between the motor current (in proportional units or p.u.), the power factor PF and the inductance angle q across different load operating regions for two different correction ratios. In this example, the motor is a 10-hp motor at 460V with a baseline correction ratio $C_{baseline}$ of 0.9. The motor current graph, the PF graph and the inductance angle graph for C=0.9 are the solid line graphs A, C and E respectively and for C=0.85 are the broken-line graphs B, D and F respectively.

As shown in FIG. 3, a comparison is made between resulting motor current information for the two levels of correction ratio C=0.9 and C'=0.85 for motor loads ranging from 20% to 130% (e.g., 0.20 to 1.30 p.u. load). As further shown, if the inductance angle φ is considered in the graphs E and F of FIG. 3, the corrected angle increases from φ to φ' for a change in correction ratio C=0.9 to C'=0.85. The reduction in the correction ratio would represent a 5% decrease in the PFC capacitors correction ability. At a typical motor load of 85% (e.g., 0.85 p.u. load), the change in correction ratio C results in a 2.7 degree increase in the inductance angle φ, which represents approximately a 0.57% decrease in the power factor PF.

Figure 4:
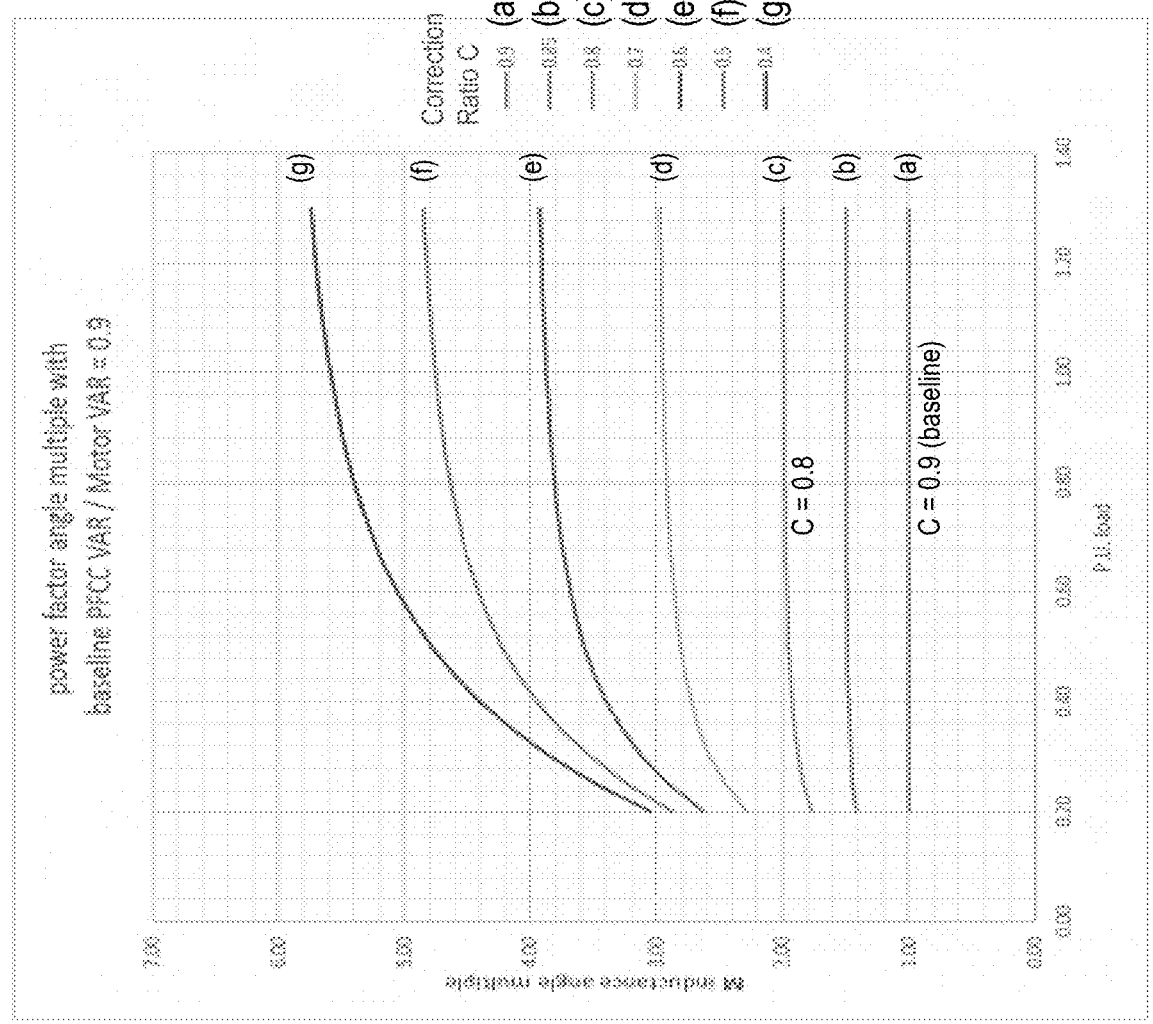
FIG. 4 illustrates an example graph showing values of an inductance angle multiple M by motor load for various correction ratios across different load operating regions, in accordance with an example embodiment of the present disclosure.

With the model of corrected power factor angle φ for various motor loads and correction ratios C, target comparison thresholds can be created and set for the motor and PFC capacitor system performance. Over time, as the PFC capacitors lose capacitance due to aging or other events, the correction ratio C will decrease from the user's target baseline value. The decrease in the correction ratio C will manifest itself as an increase in the inductance angle φ. Therefore, it is possible to define an inductance angle multiple M that is the present inductance φ divided by the baseline inductance φ. If we continue with the same 10-hp motor example in FIG. 4, the baseline correction value C is 0.9. At the baseline correction value C, the baseline inductance multiple M is 1.0 (or one) because M is normalized to the baseline inductance angle φ. The user can thus define the amount of change to capacitance correction C they wish to allow before taking some action, whether initiating a notification or other actions. The graphs in FIG. 4 show values of the inductance angle multiple M by motor load for various correction ratios across different load operating regions (e.g., graph (a) for C=0.9, graph (b) for C=8.85, graph (c) for C=8.8, graph (d) for C=8.75 and so forth to graph (g) for C=0.4). Thus, the user can define a threshold (e.g., a wear-out or abnormal level) using a specific M value over a desired load operating region for the purpose of initiating an action, such as outputting a notice or warning regarding the effectiveness of the PFC capacitor(s), temporarily interrupting power to the motor, or other actions described herein.

In a further example embodiment, an average of M can be used over a load range to define thresholds for one or more regions. Thus, for a target correction ratio C at which some action is to be taken, average M values can be calculated for different load operating regions. An example is provided in FIG. 5, which shows a Table 1 including threshold inductance angle multiple M values calculated for four load regions (e.g., 0.2-0.4, 0.4-0.6, 0.6-1.0, and 1.0-1.4), and two different correction ratio values, e.g., C=0.8 or C=0.6.

Figure 6:
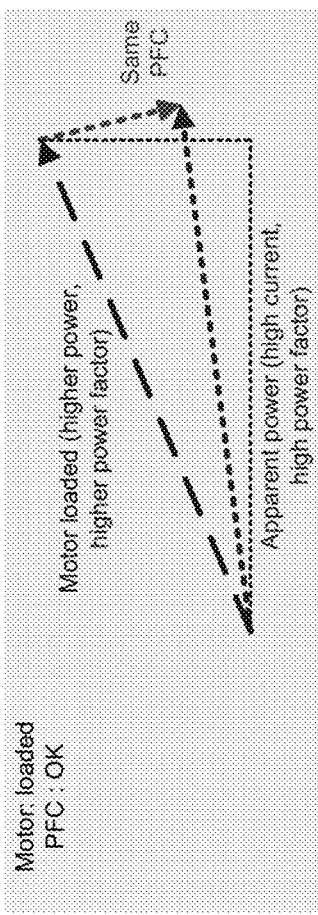
FIGS. 6 and 7 illustrate vector representations of the PFC and the apparent power under low current (e.g., unloaded), with the PFC capacitors operating within and outside of a normal range, respectively, in accordance with an example embodiment of the present disclosure.
Figure 7:
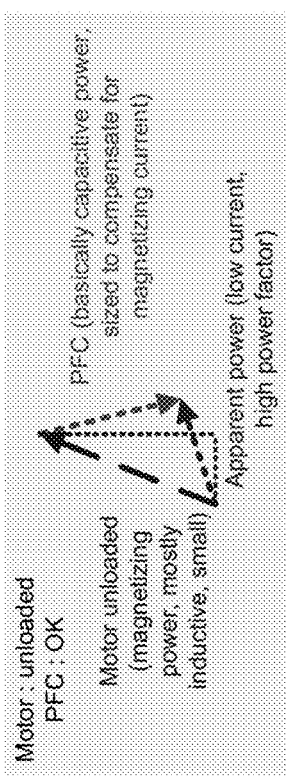
Figure 8:
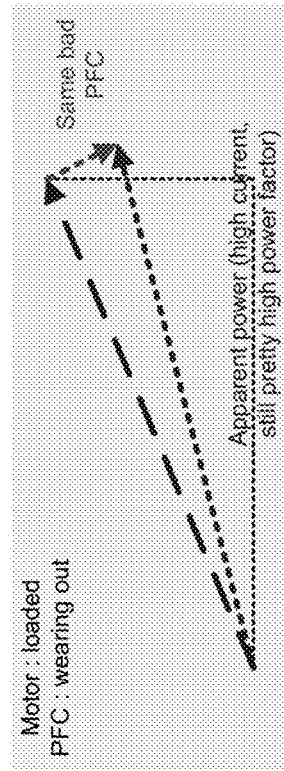
FIGS. 8 and 9 illustrate vector representations of the PFC and the apparent power under high current conditions (e.g., loaded), with the PFC capacitors operating within and outside of a normal range, respectively, in accordance with an example embodiment of the present disclosure.
Figure 9:
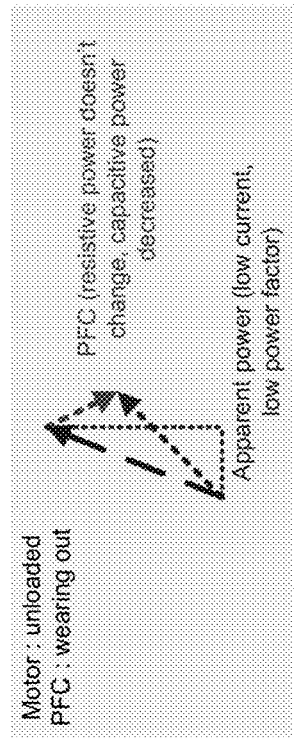

The above describes an example of the principles for monitoring PFC degradation/efficiency of the PFC capacitors in a motor circuit by monitoring a change in the inductance angle. It should be understood that the relationships defined by the equations are provided as examples, which can be varied according to the application or conditions. Furthermore, the PFC monitoring approach as described herein can use other trackable PFC-related performance parameters, such as the reactive power (VAR) or power factor, which correspond to the inductance angle or reflects the PFC contribution by the PFC capacitors in the motor circuit. A high level example showing the impact of PFC in relations to the apparent power is provided in FIGS. 6-9. FIGS. 6 and 8 show vector representations of the PFC and the apparent power under conditions of low current (e.g., unloaded) and high current (e.g., loaded), respectively. In both FIGS. 6 and 8, the PFC capacitors are operating within a normal PFC efficiency range. FIGS. 7 and 9 show vector representations of the PFC and the apparent power under low current and high current conditions, respectively, when the PFC capacitors are operating outside of a normal PFC efficiency range, e.g., low PFC.

Example PFC degradation monitoring processes using the principles described herein are discussed below with reference to FIGS. 10-13. For the purposes of explanation, the processes will be described with reference to the relay 100 and its associated components, such as in FIG. 1. In the examples, the relay 100 can be an overload relay for a starter in a motor system.

Figure 10:
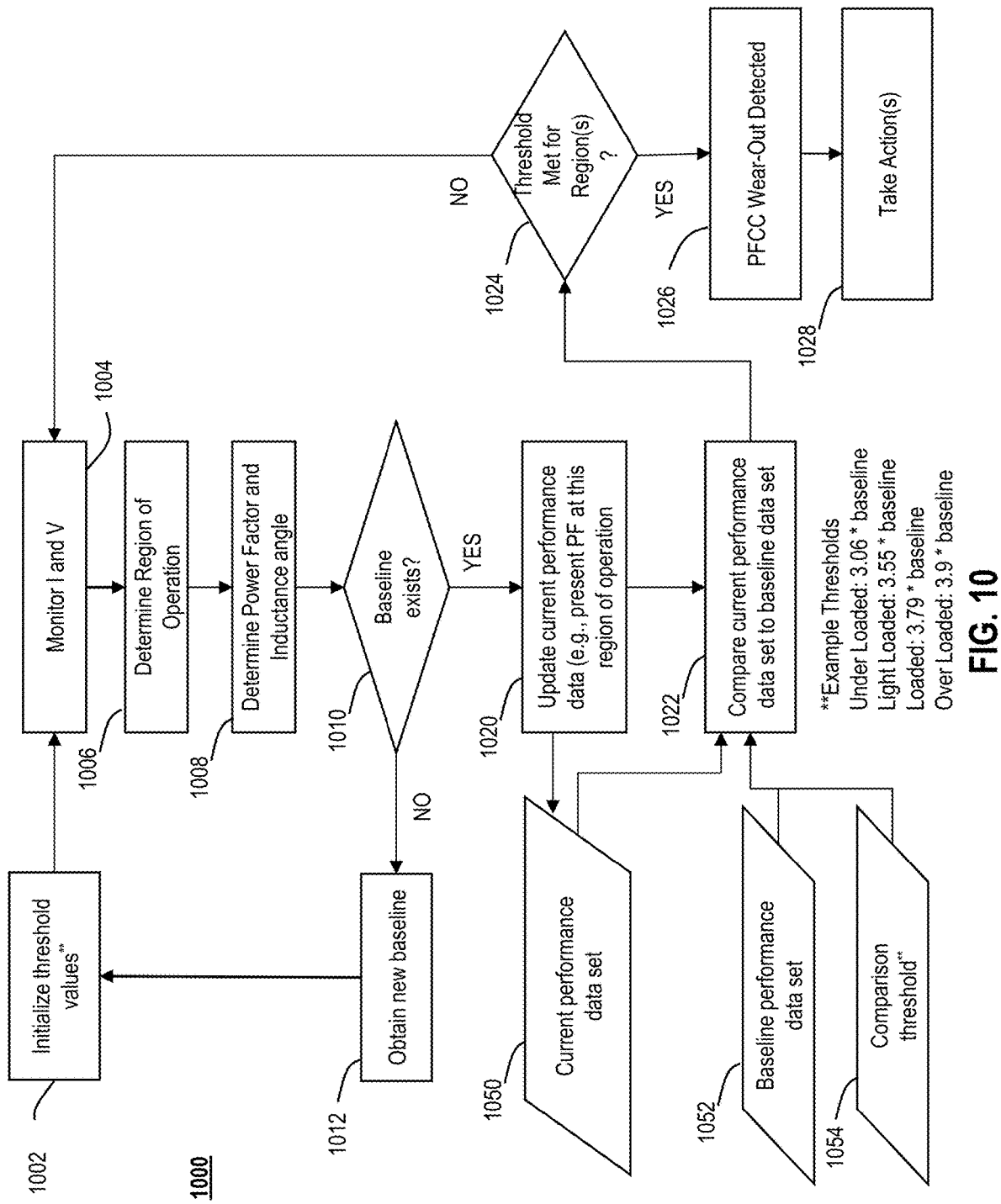
FIG. 10 illustrates an example process by which PFC degradation of PFC capacitor(s) is monitored, in accordance with an example embodiment of the present disclosure.

FIG. 10 illustrates an example process 1000 by which PFC degradation of PFC capacitor(s) is monitored. At reference 1002, the relay 100 initializes the threshold values. The threshold values can be set according to user settings or commands, such as to reflect an acceptable/unacceptable PFC efficiency level or PFC degradation percentage. Example thresholds, such as using inductance angle multiple M, are shown in Table 1 of FIG. 5 for different load operating regions (e.g., under-loaded from 0.2-04, light-loaded from 0.4-0.6, loaded from 0.6-1.0, and over-loaded from 1.0-1.4). The threshold for each of the different load operating regions can also be calculated using a different multiplier with the baseline inductance angle multiple $M_{baseline}$ (e.g., where $M_{baseline}=1$). For example, the threshold for under-loaded can be $3.06*M_{baseline}$; the threshold for light-loaded is $3.55*M_{baseline}$; the threshold for loaded is $3.79*M_{baseline}$ and the threshold for over-loaded is $3.90*M_{baseline}$.

At reference 1004, the relay 100 monitors current and voltage (e.g., on each phase) upstream of the PFC capacitors 40 using sensors 130 and 132, respectively, during operation of the motor system (e.g., 10). At reference 1006, the relay 100 determines a load operating region according to the measured current and/or voltage. At reference 1008, the relay 100 calculates the PF and the present inductance angle $\varphi_{resent}$ based on the measured current and voltage. At reference 1010, the relay 100 determines whether baseline exists, such as a baseline performance data set 1052 containing baseline inductance angles $\varphi_{baseline}$, for one or more load operating regions. If not, the relay 100 proceeds to obtain a new baseline at reference 1012. For example, a new baseline can be obtained by calculating baseline inductance angles $\varphi_{baseline}$ for the baseline performance data set 1052 and comparison thresholds 1054 for one or more load operating regions, based on known motor parameters such as the FLC from the motor nameplate, and the measured current and voltage. The baseline can be calculated during operation of the motor system 10, particularly when the correction ratio C is not known. Otherwise, the baseline inductance angles $\varphi_{baseline}$ and thresholds can be calculated using the FLC, correction ratio C, and the measured current and voltage. The process 1000 then proceeds back to reference 1002 to initialize the threshold values.

If the baseline exists at reference 1010, the relay 100 updates the current performance data set 1050 for the particular region of operation. For example, the relay 100 updates the current performance data set 1050 with the determined present inductance angle q and PF for the load operating region. The current performance data set 1050 can be maintained in a memory (e.g., the memory 120). At reference 1022, the relay 100 compares the current performance data set to a baseline performance data for the load operating region. The comparison can involve determining a present multiple inductance angle multiple $M_{present}$ based on a present inductance angle $\varphi$ and the baseline inductance angle $\varphi_{baseline}$ from the current and baseline performance data sets 1052 and 1054 stored in the memory 120, and then comparing the present inductance angle multiple M to a threshold from the comparison threshold 1054 for the load operating region. If the threshold is satisfied, e.g., the present inductance angle multiple $M_{present}$ is greater than the threshold or outside the threshold window, then the relay 100 detects PFCC wear-out, or in other words, an abnormal PFC performance by the PFC capacitors 40 at reference 1026. At reference 1028, the relay 100 can take various actions in response to the wear-out detection. These actions can include, for example, outputting a notification (e.g., a warning) to an output device of the relay 100 regarding the wear-out condition of the PFC capacitors which can include the present inductance angle $\varphi_{present}$, the present inductance angle multiple $M_{present}$, the PFC degradation percentage or PFC efficiency level relative to the baseline, the date/time, motor identifier along with other relevant motor operating information; send the notification to a central management system or to maintenance personnel via the communication device 140; store the event and associated information in a history log maintained locally in the memory 120 or at a remote memory via the communication device 140; trigger a temporary interruption of power to the motor system 10 via the switching device 30 or other power interrupt device on the motor circuit; dynamically adjust a set point of the full load current (FLC), e.g., upwards as the PLC capacitors degrade, towards the maximum FLC specified on the motor nameplate; and so forth. The central management system can schedule maintenance or repair of the PFC capacitors, or order parts (e.g., capacitors) in response to the notification.

If the threshold is not satisfied, e.g., the present inductance angle multiple $M_{present}$ is less than or equal to the threshold or within the threshold window, then the relay 100 proceeds back to reference 1004 to continue PFC degradation monitoring.

The process 1000 is provided as an example, and can monitor any number of operating regions to determine if the PFC provided by the PFC capacitors (e.g., capacitors 40) are still providing adequate correction or should be replaced. It should be understood that the order of the process operations can also be changed, combined or re-ordered in the process 1000 to implement PFC degradation monitoring.

Figure 11:
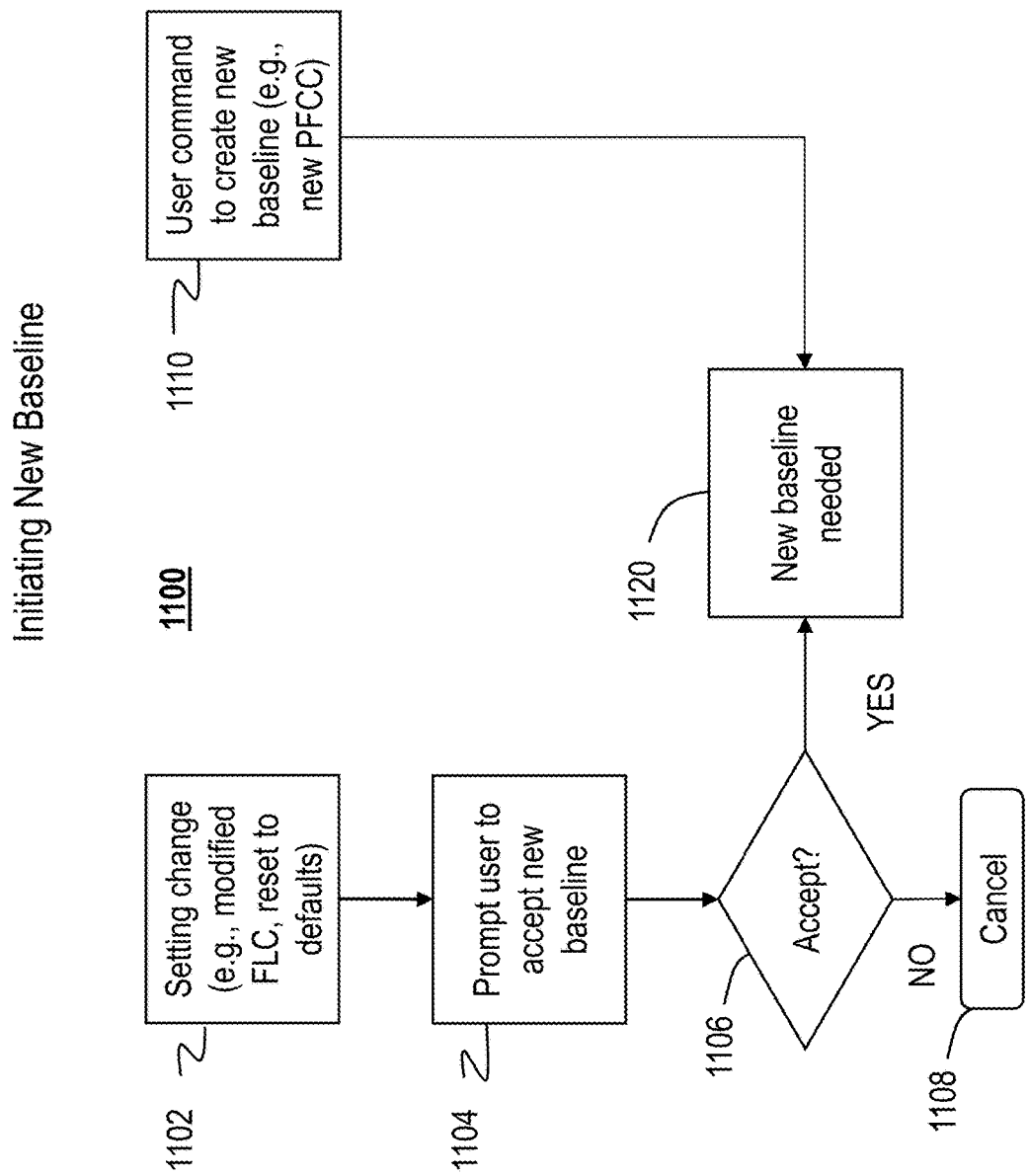
FIG. 11 illustrates an example process by which the motor management relay and its components, such as in FIG. 1, initiate a new baseline for a baseline performance data set, in accordance with an example embodiment of the present disclosure.

FIG. 11 illustrates an example process 1100 by which the relay 100 and its components initiate a new baseline for a baseline performance data set (e.g., baseline data set 1052 in FIG. 10). A new baseline can be initiated by the relay 100 when settings change at reference 1102. The settings can include changes to the FLC, to the correction ratio C or other settings for the relay 100, or a reset to defaults (e.g., default settings and values for the relay 100 or the motor system 10). The available settings can be outputted to the user via an output device on the I/O 150. At reference 1104, the relay 100 prompts the user to accept the new baseline. If the user declines to accept, then the relay 100 cancels the setting change operation. Otherwise, if the user accepts, then the relay 100 proceeds to generate a new baseline at reference 1120. As described herein, the relay 100 can calculate a new baseline performance data set using measured current and voltage, along with other motor parameters which may have been updated in light of the setting change.

In another example, the user can also initiate a request to create a new baseline at reference 1110 via a user command inputted through an input device on the I/O 150. For example, the user may request a new baseline when the motor circuit is updated, such as with new PFC capacitors. The relay 100 thereafter proceeds to create the new baseline at reference 1120. As described herein, the relay 100 can calculate a new baseline using measured current and voltage, along with other motor parameters which may have been updated in light of the user command.

Figure 12:
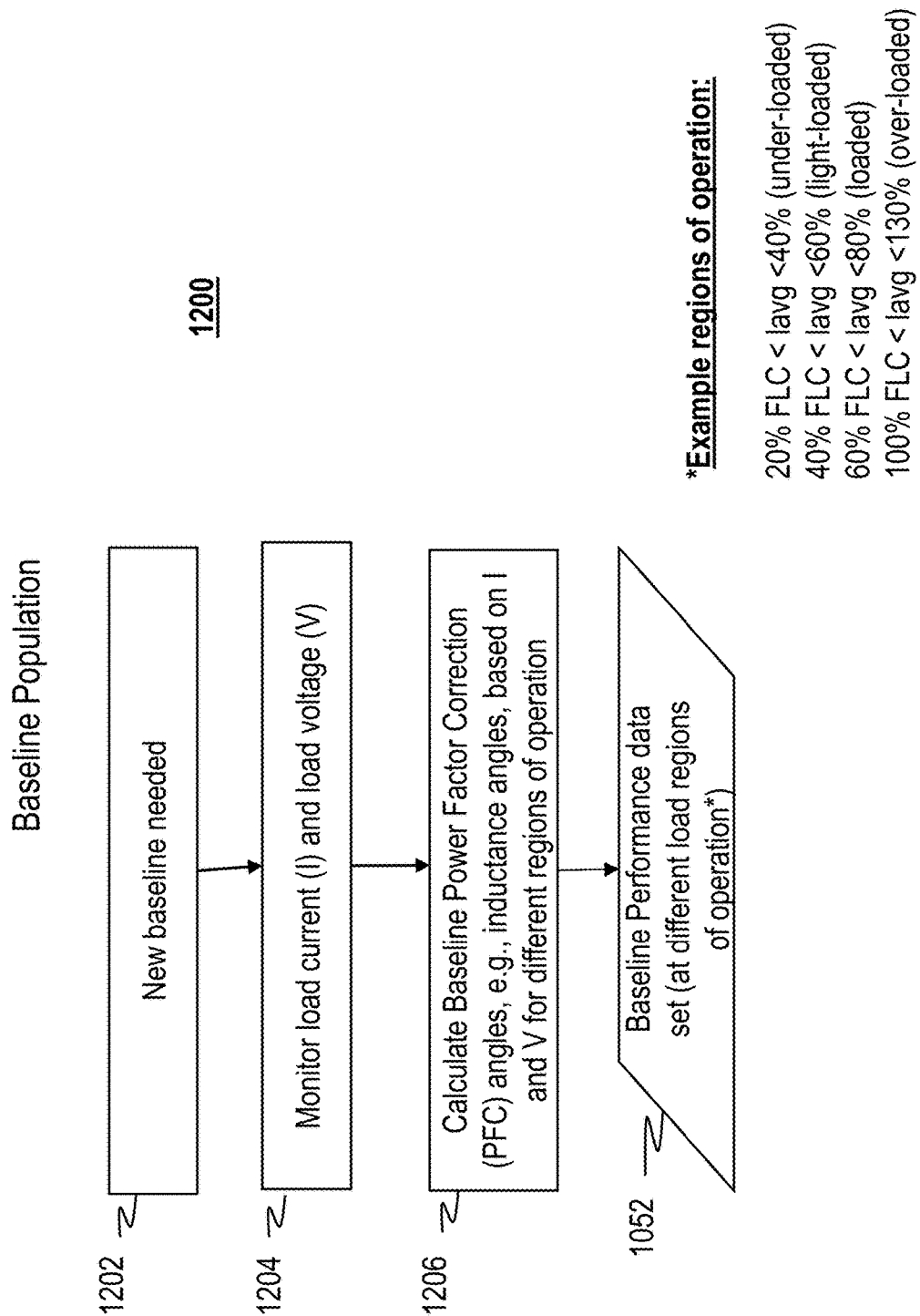
FIG. 12 illustrates an example process by which the motor management relay and its components, such as in FIG. 1, generate a new baseline for a baseline performance data set, in accordance with an example embodiment of the present disclosure.

FIG. 12 illustrates an example process 1200 by which the relay 100 and its components generate a new baseline for a baseline performance data set (e.g., baseline data set 1052 in FIG. 10). The process 1200 is one example method, which can be used generate baseline inductance angles $\varphi_{baseline}$ for different load operating regions, when the correction ratio C is unknown.

At reference 1202, the relay 100 determines that a new baseline is needed (e.g., reference 1012 in FIG. 10). At reference 1204, the relay 100 monitors the load current (I) and the load voltage (V) at a location upstream of the PFC capacitors 40 in the motor circuit. At reference 1206, the relay 100 calculates baseline inductance angles $\varphi_{baseline}$ based on the monitored current and voltage for one or more load operating regions, and updates the baseline performance data set 1054 accordingly. The process 1200 of FIG. 12 shows an example of regions of operation for the motor (e.g., the motor 20) in terms of average current as a percentage of full load current setting.

Figure 13:
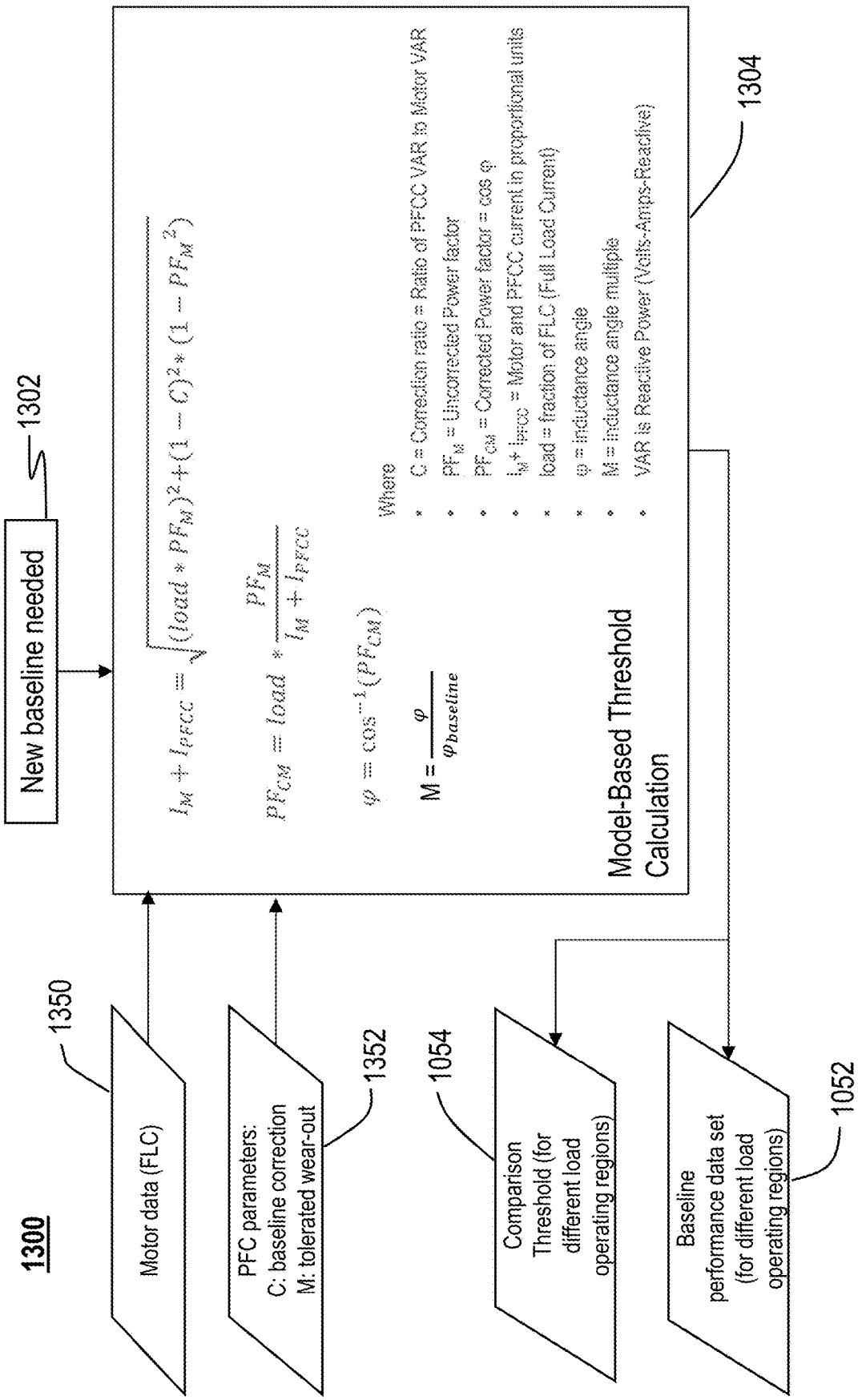
FIG. 13 illustrates an example process by which to create a model of the baseline performance data set and the comparison threshold, in accordance with an example embodiment of the present disclosure.

FIG. 13 illustrates an example process 1300 by which a model of the baseline performance data set (e.g., 1052) and the comparison threshold can be determined in advance using known motor parameters from the motor nameplate such as the FLC, the PFC parameters such as the baseline correction ratio C and the tolerated wear-out expressed as a value of an inductance angle multiple M.

At 1302, the relay 100 determines that a new baseline is needed (e.g., reference 1012 in FIG. 10). At 1304, the relay calculates baseline inductance angles $\varphi_{baseline}$ based on motor and PFC parameters, such motor data 1350 (e.g., the FLC) and the PFC parameters 1352 including the baseline correction ratio C and the tolerated wear-out provided as a value of an inductance angle multiple M for one or more load operating regions, and updates the baseline performance data set 1054 accordingly. The baseline inductance angles can be calculated using the equations (5) through (8), as previously described and also shown in FIG. 13. In this example, the mathematical model can be used to create a baseline of the observed inductance angle $\varphi_{baseline}$ based on specified motor parameters and baseline PFC correction factor. With an additional parameter of the allowable change in capacitance correction before PFC wear-out is detected or signaled to the user, it is possible for the process 1300 to create a set of thresholds tolerated across load regions of motor operation. The baseline performance data set and the comparison threshold can be generated at the relay 100, or can be generated by another computer system and subsequently stored in or uploaded to the relay 100, such as for example at the factory.

Figure 14:
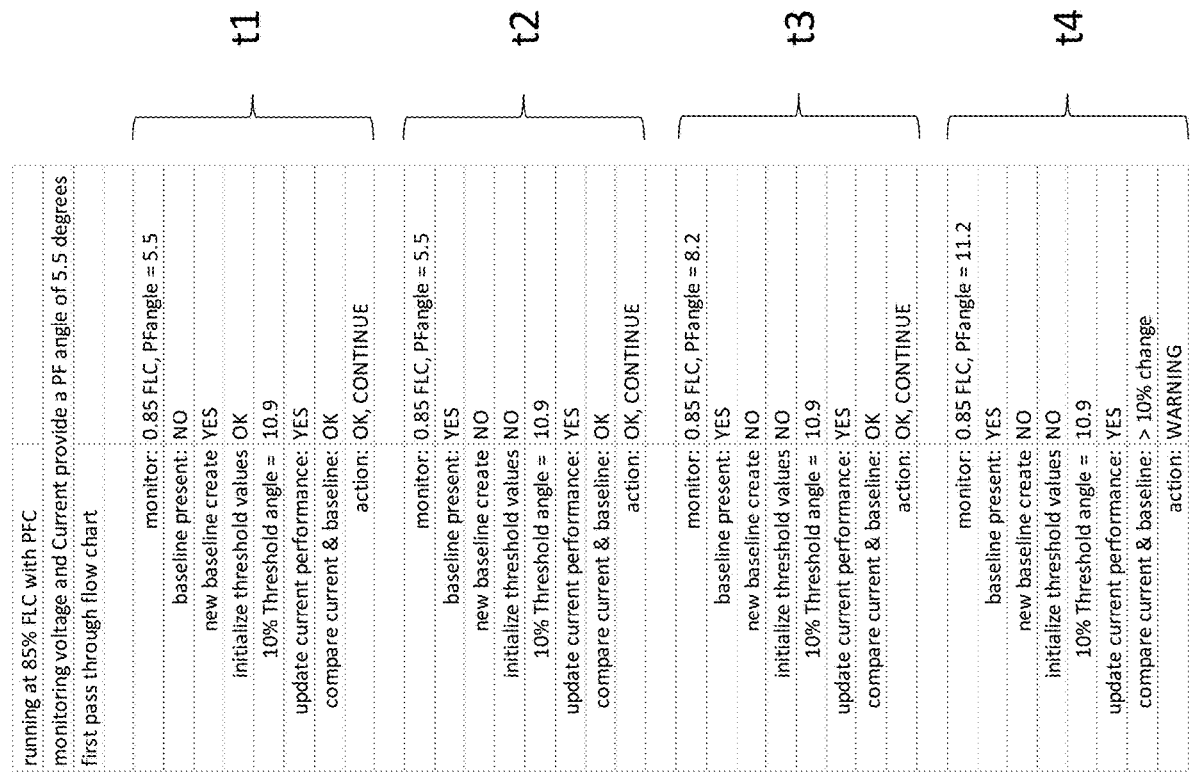
FIG. 14 illustrates an example simulation of an implementation of degradation PFC monitoring, in accordance with an example embodiment of the present disclosure.

FIG. 14 illustrates an example simulation of an implementation of degradation PFC monitoring, such as described herein, for a motor having the following characteristics: 10-hp motor at 460V, 86.5% efficiency, 14 Amps FLC, and 0.9 VAR PFCC/VAR Motor. In this example, the user has requested notification and actions to be taken when the PFC capacitor(s) loses 10% of its initial correction, and the threshold is a threshold window is the outer boundary or limit of the inductance angle (e.g., power factor angle). The threshold inductance angle is calculated to be 10.9 degrees in relations to a baseline inductance angle. The monitoring system monitors the current and voltage to determine a present inductance angle for comparison to the threshold.

As shown in FIG. 14, at a time t1, the monitoring system monitors the current and voltage, establishes a new baseline, and calculates a present inductance angle $\varphi_{present}$ of 5.5 degrees. The monitoring system continues to monitor the PFC of the motor circuit, which is within the threshold window of 10.9 degrees. At times t2 and t3, the monitoring system continues to monitor the current and voltage, and determines that the present inductance angle $\varphi_{present}$ are 5.5 and 8.2 degrees, respectively, which are both within the threshold window. Thus, the monitoring system continues to monitor the PFC in the motor circuit. At t4, the monitoring system determines that the present inductance angle $\varphi_{present}$ is now 11.2, which is outside of the threshold window and in response takes action, such as sending or outputting a warning notification. As described herein, other actions can also be taken in response to such a triggering event or condition.

B. Full Load Current Adjustment:

In accordance with a further example, a motor management relay (e.g., 100 in FIG. 1) can be an overload relay (OLR) for a motor starter, which includes as one of its setting, a load FLC such as an motor FLC. The FLC set point of the relay 100 can be dynamically adjusted to account for the state of PFC efficiency of the PFC capacitors. In this example, the relay 100 is sensing the current in the motor and the PFC capacitors. The overload's FLC set point should match the motor nameplate FLC when there is no PFC. The overload FLC set point can be lower than the motor nameplate FLC when the PFC is in operation because the motor is not using all the current the overload relay is sensing, due to the PFC capacitors providing some of the current that the relay is sensing.

Accordingly, the motor management relay 100 can be further configured to adjust the overload FLC set point based on the state of the monitored PFC capacitors. As the state of the PFC capacitors degrades over time, the relay 100 can automatically adjust the overload FLC set point towards the motor nameplate FLC (e.g., the maximum rated full load current FLC of the motor) to ensure the proper level of overload protection for the system's condition. For example, the relay 100 can be configured to establish a baseline of nominal PF and real load power; to monitor PF and real load power continuously during operation; to detect degradation of the PFC from a PF decrease versus baseline when the load is operating in a region of nominal real power output; and to increase the set point of the overload FLC towards the upper limit of motor nameplate FLC. In this way, it is possible to ensure a proper level of overload protection for the system's condition, and thus, to minimize nuisance trips and under protecting the motor from overloaded conditions.

Figure 15:
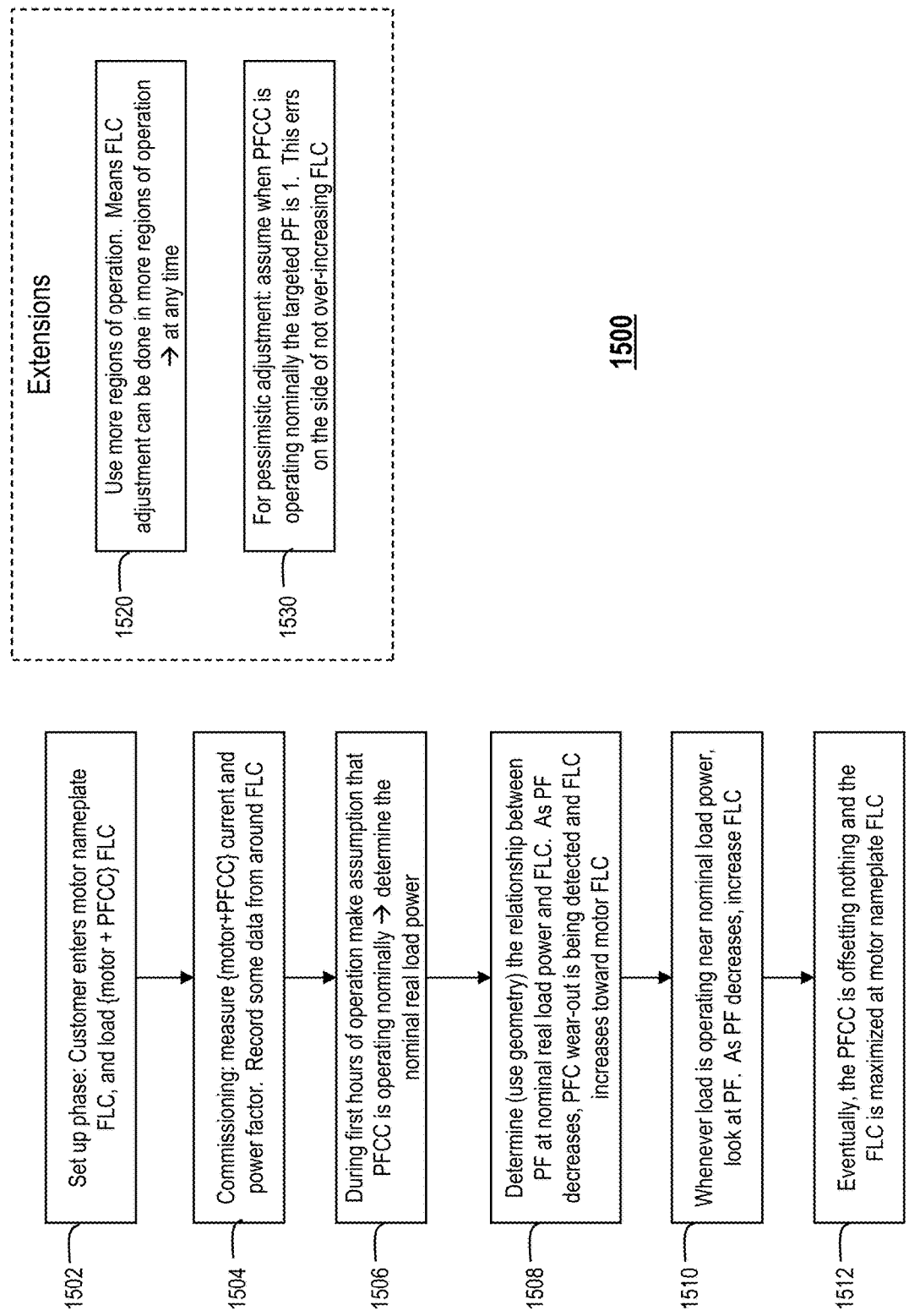
FIG. 15 illustrates an example process by which to implement automatic full load current (FLC) adjustment based on the state of the PFC capacitors, in accordance with an example embodiment of the present disclosure.

FIG. 15 illustrates an example process 1500 by which to implement automatic FLC adjustment based on the state of the PFC capacitors.

At reference 1502, the relay 100 receives information corresponding to a motor nameplate FLC, and an load {motor+PFCC} FLC from a user (e.g., a customer), such as via an input device on the I/O 150. The overload's FLC setting can initially be set at a current level, which is less than the motor nameplate FLC because the PFC capacitors, when properly operating, are providing some of the current that the OLR is sensing.

At reference 1504, the relay 100 measures the current, e.g., the {motor+PFCC} current and the power factor (PF), and records some data from around the FLC.

At reference 1506, the relay 100 determines the nominal real load power. Such a determination can take place during the initial hours of operation of the PFC capacitors in the motor circuit by assuming that the PFC capacitors are operating nominally.

At reference 1508, the relay 100 determines the relationship between the PF at a nominal real load power and the overload FLC. As PF decreases, the relay 100 detects the PFC degradation (e.g., PFC wear-out) by monitoring the inductance angle, and in response, adjusts the overload's FLC set point towards the motor nameplate FLC. Instead of inductance angle, the relay 100 can also monitor PFC degradation by calculating and monitoring the reactive power (VAR) or PF, which are interrelated to each other.

At reference 1510, the relay 100 continues to monitor the PF whenever the load is operating near nominal load power. As the PF decreases, the relay 100 increases the overload's FLC set point.

At reference 1512, the PFC capacitors eventually degrade to the point at which no PFC is provided to the motor circuit. At this point, the relay 100 can be configured to adjust the set point of the FLC to a maximum FLC, e.g., the motor nameplate FLC.

Additional extensions can be incorporated into the process 1500. For example, at reference 1520, the relay can be configured to use more regions of operations. That is, the relay 100 is configured to implement overload FLC adjustment in more load regions of operation at any time. Furthermore, at reference 1530, the relay 100 can be configured to assume that the targeted PF is 1.0 when the PFC capacitors are operating nominally. In this way, the relay 100 is operated to err on the side of not over-increasing the overload FLC in the relay.

The process 1500 describes an example implementation of adjusting a set point of the overload FLC for an overload relay, and can use similar methods, as described above, to detect for PFC degradation, but with a primary output of an automatic FLC adjustment to provide the proper level of overload protection to the motor.

Figure 16:
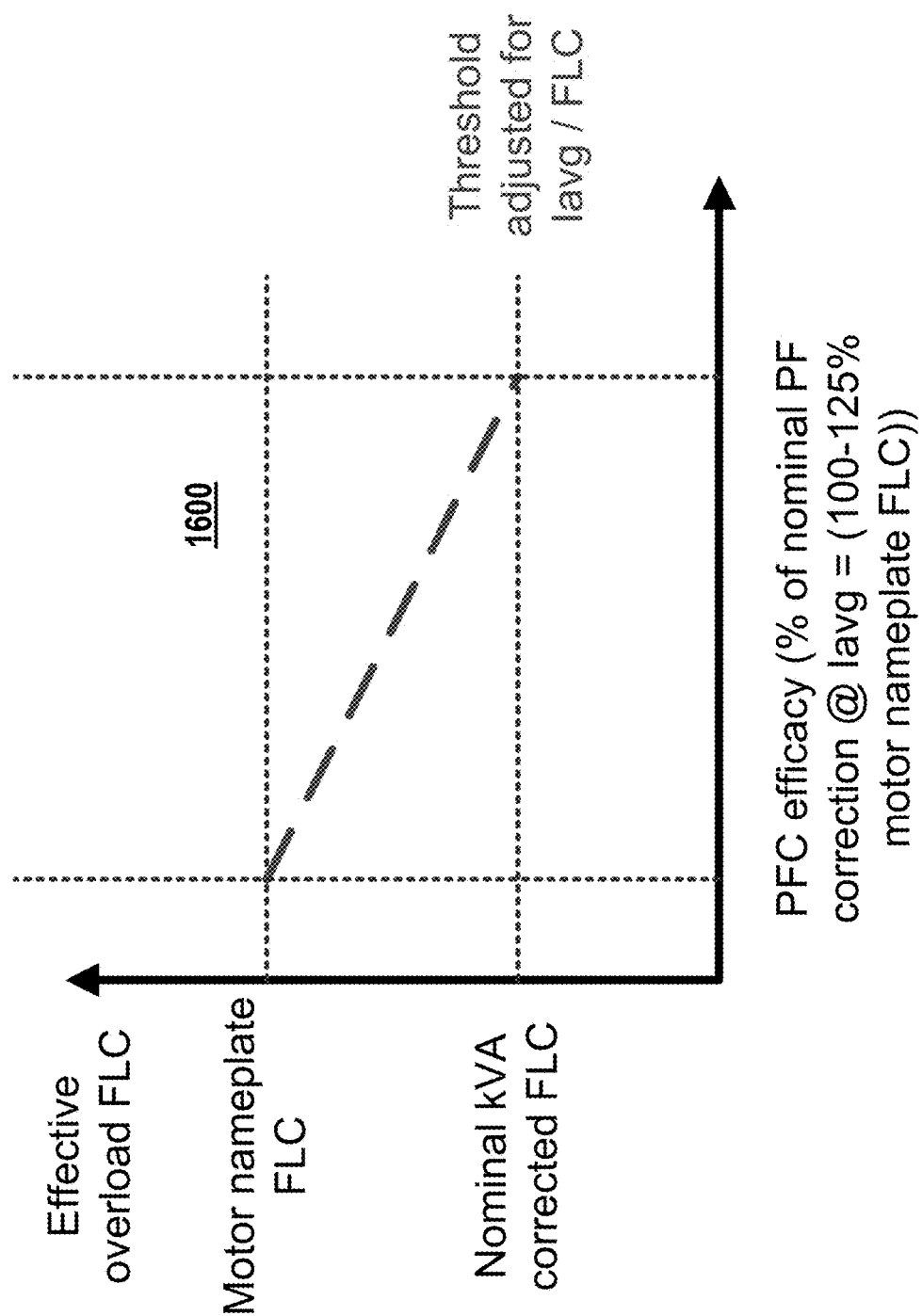
FIG. 16 illustrates a graph showing an example relationship between effective overload FLC and the PFC efficiency for an average electrical current (Iavg) of 100-125%, in accordance with an example embodiment of the present disclosure.

FIG. 16 illustrates a graph showing an example relationship between effective overload FLC and the PFC efficiency for an average load (lavg) of 100-125%. As shown in FIG. 16, the relay 100 can increase the set point of the overload FLC towards the maximum FLC (e.g., the motor nameplate FLC) as the efficiency of the PFC decreases.

It should be understood that motor system and method described herein are provided as examples, and can be implemented to determine PFC degradation or PFC efficiency of PFC capacitors in a motor system, to provide notification of such degradation/efficiency, and to dynamically adjust a set point of the full load current (FLC) for an overload relay or other electrical equipment in a motor system in which the load FLC is configurable or adjustable to improve system performance. The motor can be a polyphase motor, which is powered by a polyphase power supply.

The above describes example implementations of PFC degradation monitoring. Although the various example implementations described herein monitor and utilize inductance angle performance and threshold parameters to monitor the state of PFC in the motor circuit, other trackable PFC-related performance parameters can also be used. For example, other performance and threshold parameters can include the power factor (PF) or reactive power (VAR), which also can be calculated and monitored based on current and voltage measurements to ascertain the state of the PFC, and compared to a threshold to determine whether the PFC capacitors are no longer operating within a normal PFC operating range and to take action accordingly.

For instance, a single phase alternating current example is provided below, which can be extended to three phase current. An example method can be to sample an integer number of sinusoidal cycles of voltage (v) across, and current (i) through the load (e.g., the motor). If the root mean square (RMS) of the values is taken in the samples and multiplied together, a value for apparent power can be obtained. Using the same samples, it is possible to obtain the instantaneous power sinusoid by multiplying each sample of current and voltage for a specific point in time. The average of the instantaneous power sinusoid is the real power being drawn by the motor. The power factor can be obtained if the apparent parent and the real power are known using example equation (3).

The other components can be obtained using trigonometric properties of the right triangle formed by apparent, real and reactive power. As an example, the cosine of the angle between apparent and real power equals the power factor such as for example reflected in example equation (7). There are several ways to get the reactive component, using trigonometric relationships such as reflected in the general principles in FIG. 2.

It should also be understood that the example embodiments disclosed and taught herein are susceptible to numerous and various modifications and alternative forms. Thus, the use of a singular term, such as, but not limited to, "a" and the like, is not intended as limiting of the number of items.

It will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware or any combination thereof.

Any resulting program(s), having computer-readable program code, may be embodied on one or more computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable medium or in any transmitting medium which transmits such a program.

As indicated above, memory/storage devices can include, but are not limited to, disks, solid state drives, optical disks, removable memory devices such as smart cards, SIMs, WIMs, semiconductor memories such as RAM, ROM, PROMS, etc. Transmitting mediums include, but are not limited to, transmissions via wireless communication networks (e.g., Radio Frequency (RF) communication, the Internet, intranets, telephone/modem-based network communication, hard-wired/cabled communication network, satellite communication, and other stationary or mobile network systems/communication links.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

The invention claimed is:

1. A method of monitoring performance of at least one power factor correction capacitor employed in a circuit for supplying power to a motor, the method comprising:
   determining a plurality of baseline inductance angles and a plurality of thresholds for a plurality of load operating regions for the motor;
   monitoring a current supplied to the motor at a location upstream of the power factor correction capacitor;
   monitoring a voltage supplied to the motor;
   determining a load operating region from the plurality of load operating regions, based on the monitored current or voltage;
   selecting a baseline inductance angle from the plurality of baseline inductance angles corresponding to a baseline power factor correction by the power factor correction capacitor in the circuit, according to the determined load operation region;
   determining a present inductance angle based on the monitored current and voltage, the present inductance angle being associated with a reactive power caused by inductance of a winding of the motor when power is supplied to the motor and corresponding to a present power factor correction by the power factor correction capacitor; and
   determining when a degradation of the power factor correction of the power factor correction capacitor satisfies a threshold based on a change between the present inductance angle and the baseline inductance angle, wherein the threshold is selected from the plurality of thresholds according to the determined load operating region.

2. The method of claim 1, further comprising:
   outputting or sending a notification when the threshold is satisfied.

3. The method of claim 1, wherein the threshold corresponds to a predetermined degradation percentage from the baseline power factor correction.

4. The method of claim 3, wherein the threshold corresponds to a predetermined inductance angle multiple.

5. The method of claim 1, wherein the providing operation, the sensing operation, and the determining operations are performed by components for an overload relay, which includes a processor and a memory.

6. The method of claim 1, further comprising:
   dynamically adjusting a full load current set point for an overload relay of the motor based on the determined present inductance angle.

7. The method of claim 6, wherein the full load current set point is increased toward a maximum rated full load current as power factor correction provided by the power factor correction capacitor decreases.

8. A system comprising:
   a memory; and
   a processor, coupled to the memory, configured:
   to determine a plurality of baseline inductance angles and a plurality of thresholds for a plurality of load operating regions for the motor;
   to monitor a current supplied to the motor at a location upstream of the power factor correction capacitor;
   to monitor a voltage supplied to the motor;
   to determine a load operating region from the plurality of load operating regions, based on the monitored current or voltage;
   to select a baseline inductance angle from the plurality of baseline inductance angles corresponding to a baseline power factor correction by a power factor correction capacitor in a circuit for supplying power to a motor, according to the determined load operation region;
   to determine a present inductance angle based on the monitored current and voltage, the present inductance angle being associated with a reactive power caused by inductance of a winding of the motor when power is supplied to the motor and corresponding to a present power factor correction by the power factor correction capacitor; and
   to determine when a degradation of the power factor correction of the power factor correction capacitor satisfies a threshold based on a change between the present inductance angle and the baseline inductance angle, wherein the threshold is selected from the plurality of thresholds according to the determined load operating region.

9. The system of claim 8, wherein the processor is further configured:
   to output or send a notification when the threshold is satisfied.

10. The system of claim 8, wherein the threshold comprises a predetermined degradation percentage from the baseline power factor correction.

11. The system of claim 10, wherein the threshold corresponds to a predetermined inductance angle multiple.

12. The system of claim 8, wherein the processor and memory are part of an overload relay.

13. The system of claim 8, wherein the processor is further configured to dynamically adjust a full load current set point for an overload relay of the motor based on the determined present inductance angle.

14. The system of claim 13, wherein the full load current set point is increased toward a maximum rated full load current as power factor correction provided by the power factor correction capacitor decreases.

15. A tangible memory storage device storing computer executable code, which when executed by a processor, implements a method of monitoring performance of at least one power factor correction capacitor employed in a circuit for supplying power to a motor, the method comprising:
   determining a plurality of baseline inductance angles and a plurality of thresholds for a plurality of load operating regions for the motor;
   monitoring a current supplied to the motor at a location upstream of the power factor correction capacitor;
   monitoring a voltage supplied to the motor;
   determining a load operating region from the plurality of load operating regions, based on the monitored current or voltage;
   selecting a baseline inductance angle from the plurality of baseline inductance angles corresponding to a baseline power factor correction by the power factor correction capacitor in the circuit, according to the determined load operation region;
   determining a present inductance angle based on the monitored current and voltage, the present inductance angle being associated with a reactive power caused by inductance of a winding of the motor when power is supplied to the motor and corresponding to a present power factor correction by the power factor correction capacitor; and determining when a degradation of the power factor correction of the power factor correction capacitor satisfies a threshold based on a change between the present inductance angle and the baseline inductance angle, wherein the threshold is selected from the plurality of thresholds according to the determined load operating region.

\* \* \* \* \*